United States Patent [19]

Clube

[11] Patent Number: 5,640,257
[45] Date of Patent: Jun. 17, 1997

[54] APPARATUS AND METHOD FOR THE MANUFACTURE OF HIGH UNIFORMITY TOTAL INTERNAL REFLECTION HOLOGRAMS

[75] Inventor: Francis S. M. Clube, Neuchâtel, Switzerland

[73] Assignee: Holtronic Technologies Ltd., Marin, Switzerland

[21] Appl. No.: 519,601

[22] Filed: Aug. 25, 1995

Related U.S. Application Data

[63] Continuation-in-part of Ser. No. 75,729, Jun. 14, 1993, abandoned.

[30] Foreign Application Priority Data

Oct. 14, 1992 [GB] United Kingdom ............... 9221561

[51] Int. Cl.[6] .................... G03H 1/04; G03H 1/22; G02B 27/00
[52] U.S. Cl. ................... 359/30; 359/35; 430/1; 430/2; 430/311; 430/397
[58] Field of Search ................... 359/30, 35, 12; 430/1, 2, 311, 397

[56] References Cited

U.S. PATENT DOCUMENTS

| | | | |
|---|---|---|---|
| 3,551,019 | 12/1970 | Stetson | 359/10 |
| 3,614,189 | 10/1971 | Stewart et al. | 359/30 |
| 3,650,605 | 3/1972 | Little, Jr. | 359/15 |
| 3,796,476 | 3/1974 | Frosch et al. | 359/30 |
| 4,458,978 | 7/1984 | Am et al. | 359/30 |
| 4,597,630 | 7/1986 | Brandstetter et al. | 359/30 |
| 4,857,425 | 8/1989 | Phillips | 359/30 |
| 4,968,108 | 11/1990 | Ikeda et al. | 359/30 |
| 5,145,756 | 9/1992 | Windeln et al. | 359/28 |
| 5,270,842 | 12/1993 | Clay et al. | 359/30 |
| 5,322,747 | 6/1994 | Hugle | 359/12 |

FOREIGN PATENT DOCUMENTS

| | | |
|---|---|---|
| 0421645 | 4/1991 | European Pat. Off. . |
| 9013062 | 11/1990 | WIPO . |

OTHER PUBLICATIONS

R. Dandiker, J. Brook, "Holographic Photolithography for Submicron VLSI Structure", IEEE Conf. Proc. Holographic Systems, Components and Applications, Bath, U.K., p. 311 (1989).

S. Gray, M. Hamidi, "Holographic Microlithography for Flat Panel Displays", SID 91 Digest pp. 854–857 (1991).

B.A. Omar, F. Clube, M. Hamidi, D. Struchen, S. Gray, "Advances in Holographic Lithography", Solid State Technology, pp. 89–93, Sep. 1991.

F. Clube, S. Gray, M. Hamidi, B. Omar, D. Struchen, J–C Tisserand, "Holographic Mask–Aligner", SPIE Optical/Laser Microlithography V, vol. 1674 pp. 783–792 (1992).

K. Stetson, "Holography with Totally Internally Reflected Light", Applied Physics Letters, vol. 11, p. 225 (1967).

I.N. Ross, G.M. Davis, D. Klemitz, "High Resolution Holographic Image Projection at Visible and Ultraviolet Wavelengths", Applied Optics, vol. 27, p. 967 (1988).

*Primary Examiner*—Jon W. Henry
*Attorney, Agent, or Firm*—Leo Stanger

[57] ABSTRACT

A method for the manufacture of TIR holograms includes the division of an input laser beam into an object beam and a reference beam, the direction of the beams to a holographic recording layer so that the object beam is incident on a surface of the holographic recording layer following transmission through an object mask, so that the reference beam is incident on the other surface of the holographic recording layer at an angle such that following passage through the holographic recording layer it is totally internally reflected back into the holographic recording layer and so that the two beams are superposed at the holographic recording layer, and the displacement of the input laser beam causing the object and reference beams to traverse together the holographic recording layer. The method is especially useful for obtaining a high uniformity of exposure of the holographic recording layer.

32 Claims, 6 Drawing Sheets

APPARATUS AND METHOD FOR THE MANUFACTURE OF HIGH UNIFORMITY TOTAL INTERNAL REFLECTION HOLOGRAMS

RELATED APPLICATIONS

This is a continuation-in-part of my application Ser. No. 08/075,729 filed Jun. 14, 1993 now abandoned.

FIELD OF THE INVENTION

The present invention relates generally to the field of total internal reflection holography. In particular it relates to total internal reflection holography as employed for microlithography.

BACKGROUND ART

In the prior art total internal reflection (TIR) holograms are constructed from expanded laser beams as shown schematically in FIG. 1. One of these, the object beam 1, is directed through a mask transparency 2 to a holographic recording layer 3 on a substrate 4 in optical contact with a large prism 5. The other, the reference beam 6, is directed through another face of the prism 5 so that it is totally reflected from the surface of the holographic layer 3. The optical interference of the two beams is recorded by the layer's photosensitive material. Once fixed, the hologram can be reconstructed by irradiating it with a laser beam directed in the opposite direction to the original reference beam 6.

TIR holograms have the capability of recording and reconstructing images over large geometrical areas. With modern photopolymeric recording materials, TIR holograms have shown significant potential for high resolution photolithography.

One of the problems encountered when applying TIR holography to photolithography, such as for the microelectronics industry, is that the brightness of the reconstructed images needs to be very uniform (preferably better than ±2%) over their areas. For this to be achieved with the prior art it is therefore desirable that at hologram recording the expanded laser beams have good uniformity across their wavefronts. Unfortunately this is difficult to achieve because of the natural variation in irradiance of a laser beam: most beams have a Gaussian intensity profile, making their edges less bright than their centre.

A more uniform lightfield at the recording layer could, in principle, be achieved by expanding the beam well beyond what is needed and using the centre only. However, beam uniformity achieved this way is only at the expense of the light available. It has been estimated that to achieve ±2% uniformity, only about 2% of the laser energy could be used and this would increase exposure times beyond practicality.

Uniformity of printing exposure could also be achieved by recording a hologram with a well-behaved efficiency non-uniformity (eg. Gaussian) across its surface and then, during printing, to compensate for the non-uniformity by scanning the reconstruction beam over the hologram area and varying either the beam's intensity or scan-speed as it scans. However, because of the compromises being made in both mean hologram efficiency and mean laser power, this would necessarily lead to longer print times and consequently a lower throughput, which are undesirable for many industrial applications. Also, the assumption of a Gaussian intensity profile can often be an over-simplification.

In addition, both the above methods for improving uniformity require low-aberration collimating lenses (or mirrors) operating in the UV (typically 364 nm) for generating the object and reference beams. For large diameter (eg. 8", 12", 20") holograms intended for, for instance, manufacturing large-area flat panel displays, this becomes most unattractive.

Another problem encountered in the manufacture of large area TIR holograms for microlithographic applications relates to the depth of focus of the reconstructed images. In order that a TIR hologram correctly prints an image onto, for instance, a silicon wafer, it is necessary that the wafer's surface be accurately positioned with respect to the projected image. If the wafer surface is either a small distance in front of or behind the image, the printed image will be out-of-focus. Typically, if the features in the image are of dimension ~0.5 µm, the wafer surface needs to be positioned to ~±0.2 µm accuracy. In order to facilitate this, it is desirable that all features in the reconstructed image lie at the same distance from the hologram's surface. Using the prior art this demands that the separation of the object mask and holographic layer during recording be the same (to ~±0.1 µm) across their area. However, because of the difficulty in obtaining sufficiently flat object masks and sufficiently flat recording layers, and the difficulty in supporting them in such a way that they remain flat during hologram recording, the degree of parallelism required becomes impractical.

In seeking a solution to the above problems it is of prime importance to take into account the extreme sensitivity of hologram formation to mechanical (and other) instabilities. A hologram is a recording of an optical interference pattern and so will only be formed successfully if at each point on the recording surface the relative phases of the interfering object and reference beams are substantially constant during the exposure process. To quantify this, the relative phases should be constant to preferably better than 2λ/10, meaning that the relative lengths of the object and reference beam optical paths to any point on the holographic layer should not change by more than ~30 nm during the recording operation; if this condition is violated the interference pattern will be "washed out" and the hologram will be lost.

SUMMARY OF THE INVENTION

It is therefore an object of the present invention to provide a method whereby total internal reflection holograms can be recorded with high uniformity of exposure over large areas.

According to a first aspect of the present invention, there is provided a method for recording a total internal reflection hologram, which method includes:

a) dividing an input laser beam into an object beam and a reference beam;

b) directing the two beams to a holographic recording layer so that the object beam is incident on one surface of the holographic recording layer following transmission through an object mask, so that the reference beam is incident on the other surface of the holographic recording layer at an angle such that following passage through the holographic recording layer the beam is totally internally reflected back into the holographic recording layer and so that the object and reference beams are superposed at the holographic recording layer such that they are aligned and remain aligned as the beams traverse the holographic recording layer; and c) displacing said input laser beam so that the object and reference beams traverse the holographic recording layer.

The method of the invention is particularly useful for obtaining a uniform exposure across the recording layer. In this case the input beam would be displaced by a scanner system such that the beams traverse the layer in preferably a raster pattern.

The method may alternatively be used for deliberately introducing a particular non-uniformity of exposure across the recording layer, in which case either the intensity of the input laser beam or the motion of the scanner would be varied appropriately through the course of the scan.

The method may be employed to selectively expose a part or parts of the mask and holographic layer, with the possibility of changing the mask between parts of the exposure.

The method permits measurement (using, for instance, the technique as described in our Patent Application EP-A-0421645) and adjustment of the local separation of the object transparency and recording layer where exposure is taking place in order that a constant separation be obtained, for the purpose of enabling an accurately focussed image to be printed during hologram reconstruction.

A further advantage of scanning the construction beams is that it can significantly suppress the problem of laser speckle, especially that generated by large-area collimating optics and by beam apertures, thereby enhancing the quality of the reconstructed images.

By the above method, in which the mechanical scanning is performed prior to beam division, instabilities introduced into the laser wavefronts by irregularities in the motion of the scanner system are common to both object and reference beams, thus allowing their relative phases at the recording layer to remain substantially constant.

In TIR holography as described in the prior art, the object beam arrives at the holographic layer at or near normal incidence whereas the reference beam arrives at or near 45° incidence. Thus, if only mirrors were used to direct the object and reference beams to the recording layer, the reference beam would illuminate an area of the recording layer 2 times greater than the area occupied by the object beam and furthermore would scan across the layer at a speed 2 times faster than the object beam. The result would be a variation in holographic exposure over the layer. Beam superposition, so that the beams remain overlapped as they are scanned, as required in step (b) of the above method, can best be obtained by either i) employing optical elements in the reference beam path to compress the beam in the plane of incidence of the reference beam at the holographic layer; or ii) employing optical elements in the object beam path to expand the beam in the plane of incidence of the reference beam at the holographic layer.

The beam alignment in step (b) also provides stability of the relative phases of the interfering beams. The relative phases of the beams are sensitive to angular perturbations of the scanning beams introduced by, for instance, wobble (yaw, pitch and roll) of the scanner system. This sensitivity to scanner wobble is significantly reduced by providing accurate alignment between the superposed beams.

To the above method may be added the further step of arranging the paths of the object and reference beams to be such that the misalignment of the beams at the recording layer produced by an angular displacement of the object and reference beams, arising from a displacement of the input beam, is minimised, taking into account all parts of the holographic layer. This procedure serves to further suppress the sensitivity of the optical interference pattern recorded in the hologram to irregularities in the motion of the scanner system.

According to a second aspect of the present invention, there is provided an apparatus for recording a total internal reflection hologram, which apparatus includes:

a) a means for dividing an input laser beam into an object beam and a reference beam;

b) a means for directing the object and reference beams to a holographic recording layer so that the object beam is incident on a surface of the holographic recording layer following transmission through an object mask, so that the reference beam is incident on the other surface of the holographic recording layer at an angle such that following passage through the holographic recording layer it is totally internally reflected back into the holographic recording layer, and so that the object and reference beams are superposed at the holographic recording layer such that they are aligned and remain aligned as the beams traverse the holographic recording layer; and c) a means for displacing the input laser beam so that the object and reference beams traverse the holographic recording layer.

For the (usual) case where the object beam arrives at the holographic layer at an angle of incidence smaller than that of the reference beam, feature (b) of the second aspect of the invention would preferably include either i) a prism cylindrical lens system or diffraction grating in the reference beam path to compress the beam in one dimension by refraction or diffraction; or ii) a prism, cylindrical lens system or diffraction grating in the object beam path to expand the beam in one dimension by refraction or diffraction.

Feature (b) would preferably allow beam superposition to be carried out with precision (the accuracy depending primarily on the magnitude of wobble present in the scanner system) in order to suppress the sensitivity of the optical interference pattern to irregularities in the motion of the scanner system.

Feature (b) would preferably be employed for the additional purpose of arranging the paths of the object and reference beams to be such that the misalignment of the beams at the recording layer arising from an angular displacement of the object and reference beams, caused by a displacement of the input beam, is minimised, taking into account all parts of the recording layer. In this way the sensitivity of the relative phases of the interfering object and reference beams to angular perturbations of the beams caused by, for instance, mechanical wobble of the scanner system can be minimised.

If scanning is being performed in order that all parts of the reconstructed image lie at the same distance from the holographic layer, the above apparatus would further include a means for measuring the separation of all parts of the object transparency and the holographic layer over their area and a means for adjusting the separation such the separation where exposure is taking place remains constant as the beams are scanned.

DESCRIPTION OF THE DRAWINGS

The present invention will now be described in greater detail by way of example with reference to the accompanying drawings, wherein.

DESCRIPTION OF THE PREFERRED EMBODIMENTS

Figure 1:
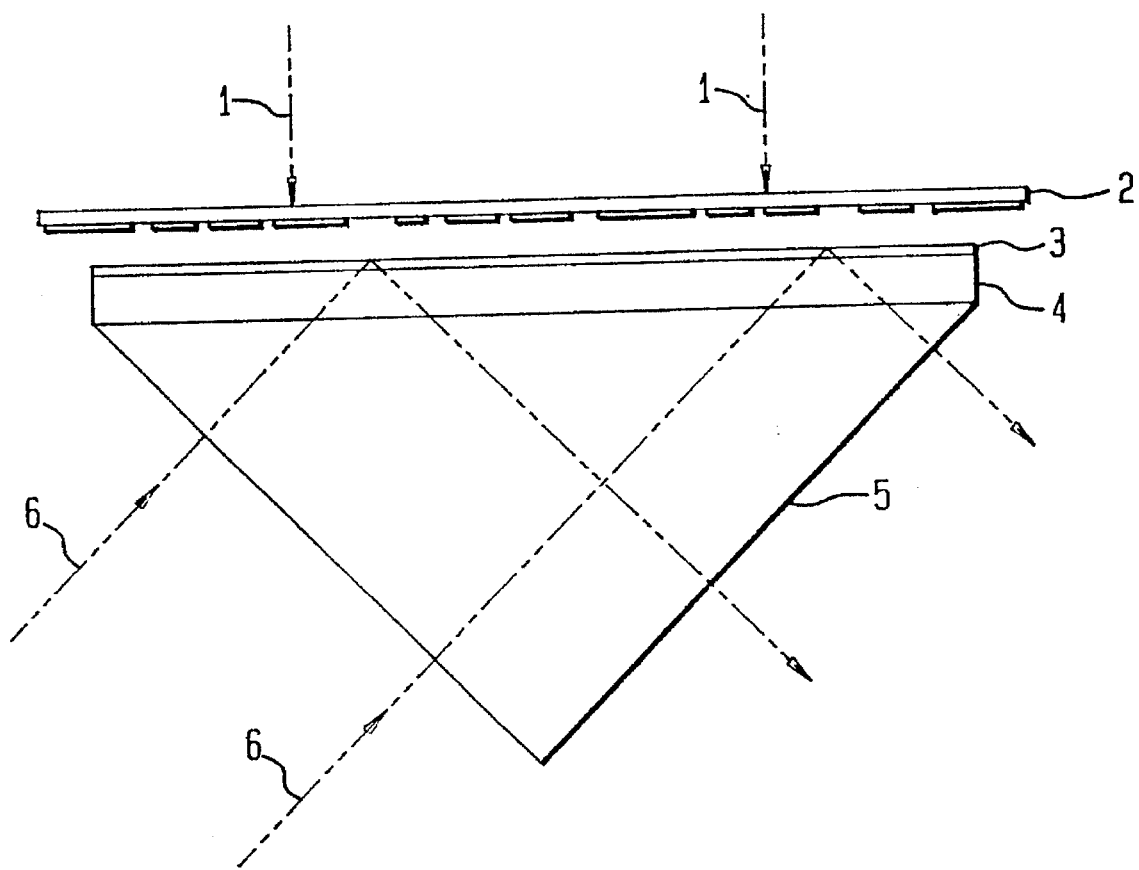
FIG. 1, already described, shows the main principles of TIR holography.
Figure 2:
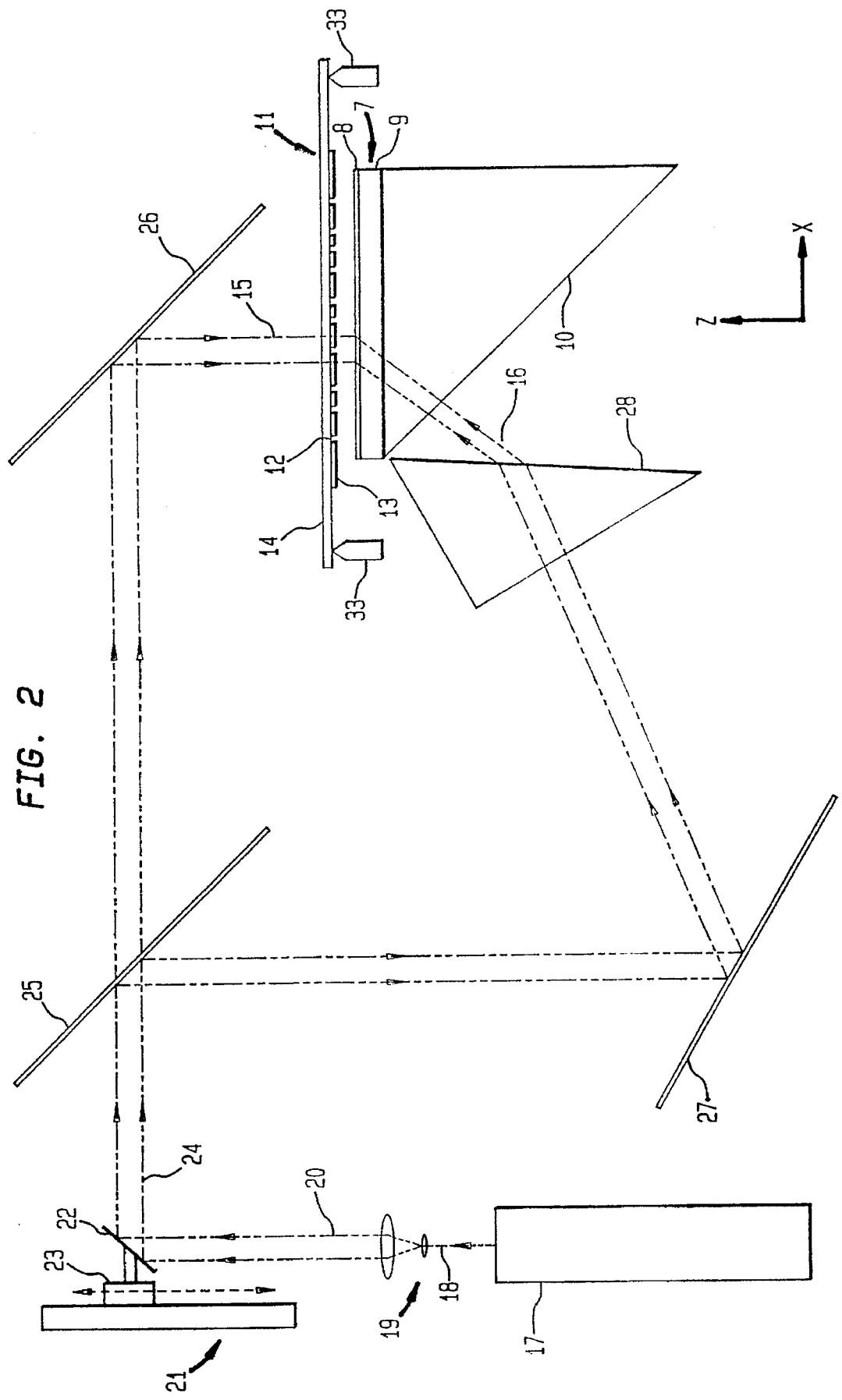
FIG. 2 is a schematic representation of one preferred embodiment for recording a total interference reflection hologram with high uniformity of exposure.

In the arrangement of FIG. 2, a holographic plate 7, comprising a thin (typically 20 µm) layer 8 of a holographic recording material spun onto a glass substrate 9 of dimensions ~10 cm×10 cm, is placed in optical contact with one of the shorter sides of a 45°, 45°, 90° glass prism 10. A suitable holographic recording material would be one of the holographic photopolymers manufactured by DuPont de Nemours & Co, such as that identified by HRS-352, which is sensitive in the UV and records an optical interference pattern as a modulation of refractive index. Optical contacting of the holographic plate 7 to the prism 10 may be achieved using xylene, a transparent fluid that has low volatility and a refractive index close to that of glass.

Above the recording layer 8 and in proximity to it is positioned an object mask comprising features 12 etched into a layer of chrome 3 on the surface of a glass plate 14. The mask is located on piezo-electric transducers 33 in FIGS. 2 and 3 which permit the mask to be located at a particular distance and parallel to the layer.

Two mutually coherent laser beams, an object beam 15 and a reference beam 16, illuminate this system. The two are derived from an argon ion laser 17 operating at a wavelength of 364 nm and incorporating an etalon to give the beam a high temporal coherence. The output 18 of the laser passes through a beam expander 19 transforming it into a ~2 cm diameter (defined by the $1/e^2$ intensity points) collimated beam 20 with a Gaussian profile. The beam 20 enters a mechanical scanner system 21 comprising mirrors 22 mounted on two computer-controlled stages 23 that travel parallel to the y and z axes respectively (in the figure only a one-dimensional stage movement is however illustrated). The motion of the stages is such that the input beam 24 leaving the system, oriented parallel to the x-axis, is raster scanned across a large beamsplitter 25. A step size of 5 mm (i.e. ~¼ of the beam diameter) between successive passes of the scanning motion ensures that the integrated light intensity at the holographic layer has good uniformity. The speed, v, of each scan pass is determined from the energy density, E, necessary to expose the hologram, according to $$v = \frac{P}{E \times s}$$

where P is the power in the input beam 24 and s is the size of the step between successive passes of the scan at the holographic recording layer.

So, if the exposure energy density required is 20 mJ/cm$^2$, the power in the input beam is 100 mW and the step size is 5 mm, the scan speed necessary is 10 cm/s.

It should be noted that a scanning motion of the beam at the holographic layer could also be generated by a rotational motion of a mechanical scanner.

That part of the beam transmitted by the beamsplitter 25, forming the object beam 15, is reflected from a mirror 26 and arrives at the object mask 11 at normal incidence, thence illuminating the recording layer 8. The part of the beam reflected by the beamsplitter 25, forming the reference beam 16, is reflected by a mirror 27 and enters at normal incidence a face of an auxiliary glass prism 28. The beam refracted by the auxiliary prism 28 passes through the hypotenuse face of the prism 10 supporting the holographic plate 7, arriving at the holographic layer 8 at an angle of 45°, whereupon it is totally internally reflected from the upper surface of the layer 8.

From the figure it can be seen that although the object and reference beams 15 and 16 are incident on the holographic layer 8 at very different angles, they illuminate equal areas. Furthermore, as the input beam 24 is scanned across the beamsplitter 25, so the object and reference beams 15 and 16 traverse the layer 8 at the same speed. This is attributable to the auxiliary prism 28 which has the function of compressing the reference beam 16 in the plane of incidence of the reference beam at the layer 8 in order to compensate for the beam's projected cross-section at the layer 8. In general terms, if the angles of incidence of the object and reference beams 15 and 16 at the recording layer 8 are $\theta_o$ and $\theta_r$ respectively then the required compression factor, c, that is, the ratio of the widths $w_2$ and $w_1$ of the beams leaving and entering the auxiliary prism 28, is given by $$c = \frac{w_2}{w_1} = \frac{\cos \theta_r}{\cos \theta_o}$$

The angle, φ, required between the two faces of the auxiliary prism 28 oriented as in FIG. 2 for producing a compression factor c is calculated from $$\sin^2 \phi = \frac{1-c^2}{n^2-c^2}$$

where n is the refractive index of the auxiliary prism material.

So, for the particular geometry under consideration, in which $\theta_o = 0°$ and $\theta_r = 45°$, the compression factor required is 0.707. Hence, taking the refractive index of the prism material as 1.5, the angle, φ, needed between the two faces of the auxiliary prism 28 is ~32°.

Equalisation of the object and reference beam diameters at the holographic layer 8 could alternatively be accomplished by employing the auxiliary prism 28 in the object beam path in order to expand the object beam is.

The paths of the object and reference beams 15 and 6 are also arranged in order to suppress the sensitivity of the optical interference pattern recorded in the holographic layer to wobble (pitch, roll or yaw) of the scanner system 21.

It requires firstly that the object and reference beams 15 and 16 are accurately aligned at the holographic layer 8. The precision of beam alignment depends on the degree of wobble present in the scanner system 21, but typically if the scanner wobbles by ~0.1 mR, the beams 15 and 16 should be aligned to better than ½ mm. It may be a accomplished by introducing a knife edge into the input beam 24 before the beamsplitter 25 and then adjusting the positions and orientations of the optical elements in the object and reference beam paths until the projected shadows of the knife edge in the object and reference beam are coincident at the plane of the recording layer. The shadows in the UV beams may be observed with the aid of a fluorescent screen.

Figure 3:
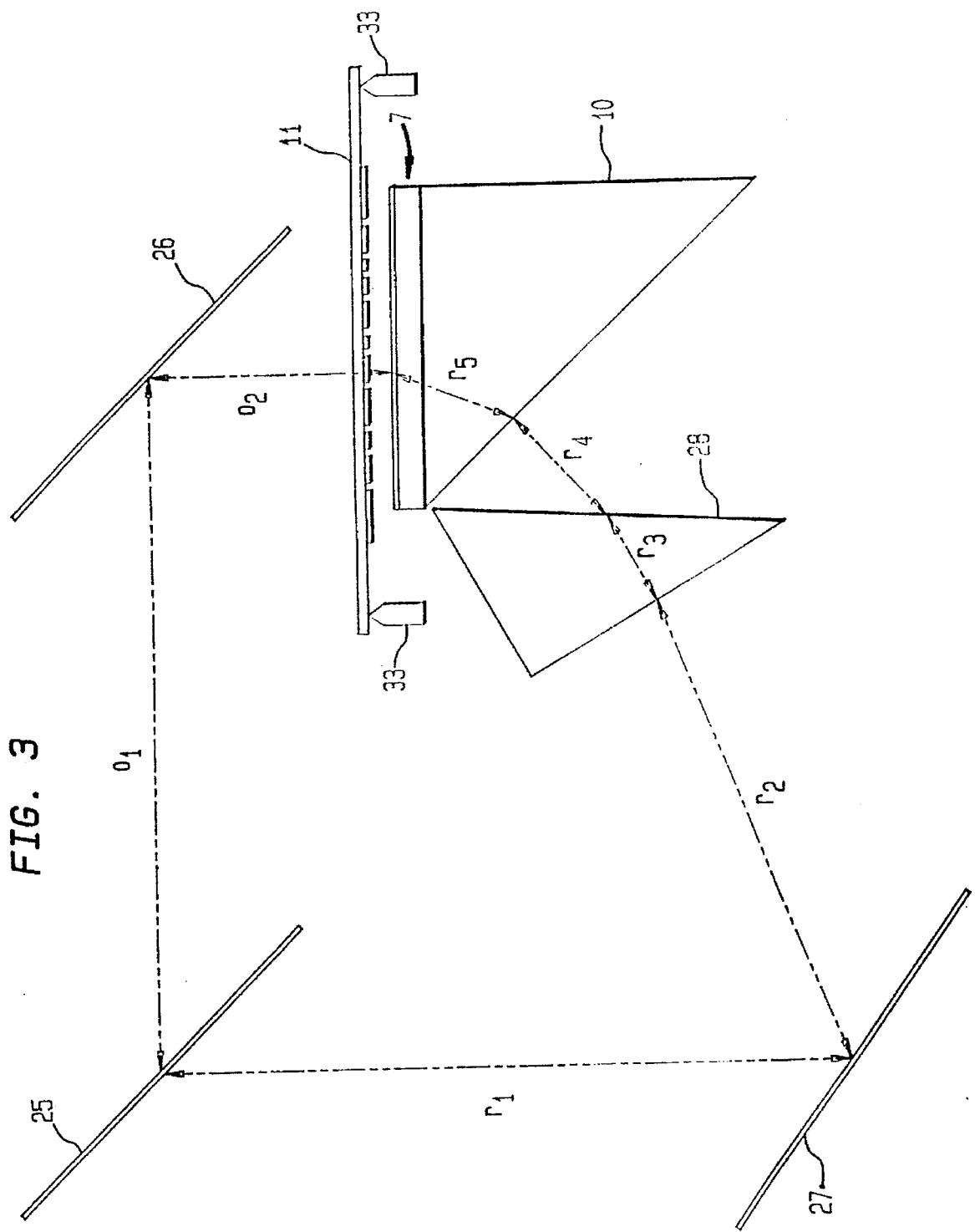
FIG. 3 labels the lengths of the various sections of the object and reference beam paths.

The second consideration is the minimisation of beam misalignment at the holographic layer produced by an angular displacement of the input beam 24 due to wobble of the scanner system. This minimisation should take into account angular displacements of the input beam in both planes (xy and xz) and should take into account all parts of the holographic layer 8. Referring to FIG. 3, which labels the lengths of the various sections of the object and reference beam paths, the sensitivity of the optical interference pattern to scanner wobble is kept low if it is arranged that $$o_1 + o_2 = r_1 + r_2 + \frac{r_3}{n} + \frac{3r_4}{2} + \frac{3r_5}{2n}$$

where n is the refractive index of glass.

With the beam paths satisfying the above condition, hologram recording is reasonably tolerant to wobble in the scanner system. It should be mentioned that incorporating the auxiliary prism 28 in the object beam path near the mask 11 permits enhanced insensitivity of the interference pattern to scanner wobble (because the condition on the relative optical path lengths of the object and reference beams for minimising the sensitivity to wobble of the input beam in the xy plane and the corresponding condition for the xz plane are more similar), but may be at the expense of accessibility to the mask 11 and holographic plate 7.

Once the laser beams 15 and 16 have completed their scan the holographic plate 7 is removed from the prism 10 and the holographic layer 8 is fixed. For those holographic materials where the efficiency of the hologram is dependent on the time delay between holographic exposure and fixing, the fixing is best carried out by gradually introducing the plate to the fixing process in order that the time delay between exposure and fixing for each part of the holographic layer is the same. In the case of fixing by incoherent UV illumination, this may be achieved by combining a UV illumination source, condenser and collimation optics with the holographic exposure apparatus and modifying the scanning system such that an incoherent UV beam scans the holographic layer behind or after the hologram-forming beams.

Hologram reconstruction may then proceed.

Figure 4:
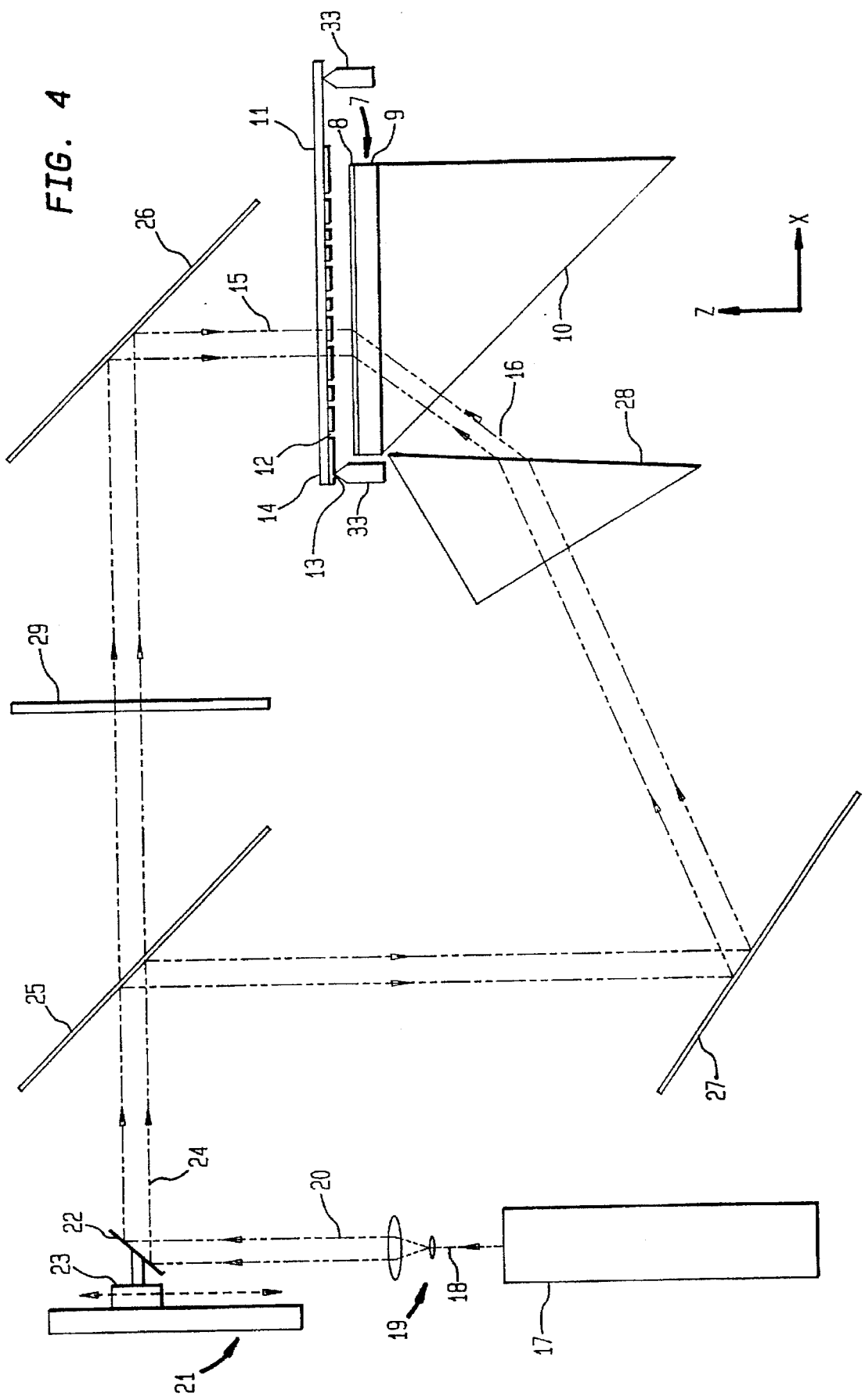
FIGS. 4 and 5 are schematic illustrations showing other embodiments of the invention.
Figure 5:
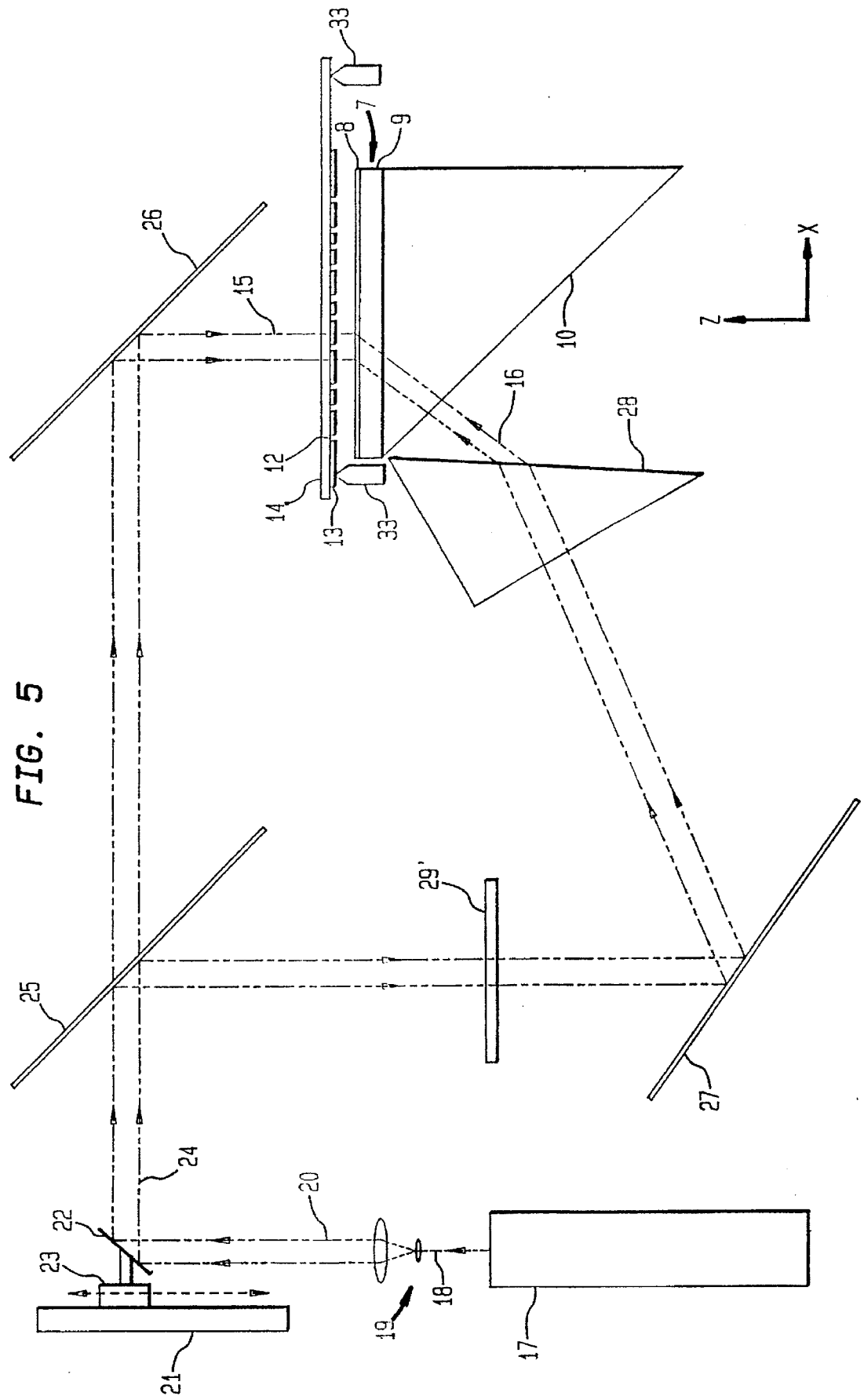

Other embodiments of the invention appear in FIGS. 4 and 5. These embodiments employ the structure of FIG. 2 and like members are identified with like reference characters. The structure of FIG. 4 differs from that of FIG. 2 in that a filter plate 29 appears in the path of the object beam 15. In FIG. 5 a filter plate 29' appears in the path of the reference beam 16. These filter plates 29 and 29' adjust the ratio of the intensities of the object and reference beams 15 and 16 at the holographic recording layer 8 to optimize the quality of the recorded image. The transmission or absorption of the filter plate 29 or 29' depends on the ratio of the intensities of the transmitted and reflected beams produced by the beamsplitter 25 and the ratios of the intensities desired at the hologram recording layer.

For instance, if the ratio of the transmitted and reflected beams produced by the beamsplitter is 1:1, and the optimum ratio of the intensities of the object and reference beams at the recording layer is 1:10, absorber plate 29 in FIG. 4 with a transmission of 10% is employed in order that the ratio of the intensities of the object and reference beams at the recording layer is the desired optimum. Similarly, if the ratio of the transmitted and reflected beams produced by the beamsplitter is one value, and the optimum ratio of the intensities of the object and reference beams at the recording layer is a given value, absorber plate 29' with an appropriate transmission percentage is employed in order that the ratio of the intensities of the object and reference beams at the recording layer is the desired optimum.

It should be noted that the ratios and transmission percentages mentioned are examples only. The selection of ratios and transmission percentages depends on the devices being used and are chosen to obtain desired optimum conditions.

With an absorber plate included in the apparatus the speed of the beam required to expose the recording layer with the correct energy density is calculated using the same formula as above but assigning to the parameter P the total power in the beams illuminating the recording layer instead of the power in the input beam.

Figure 6:
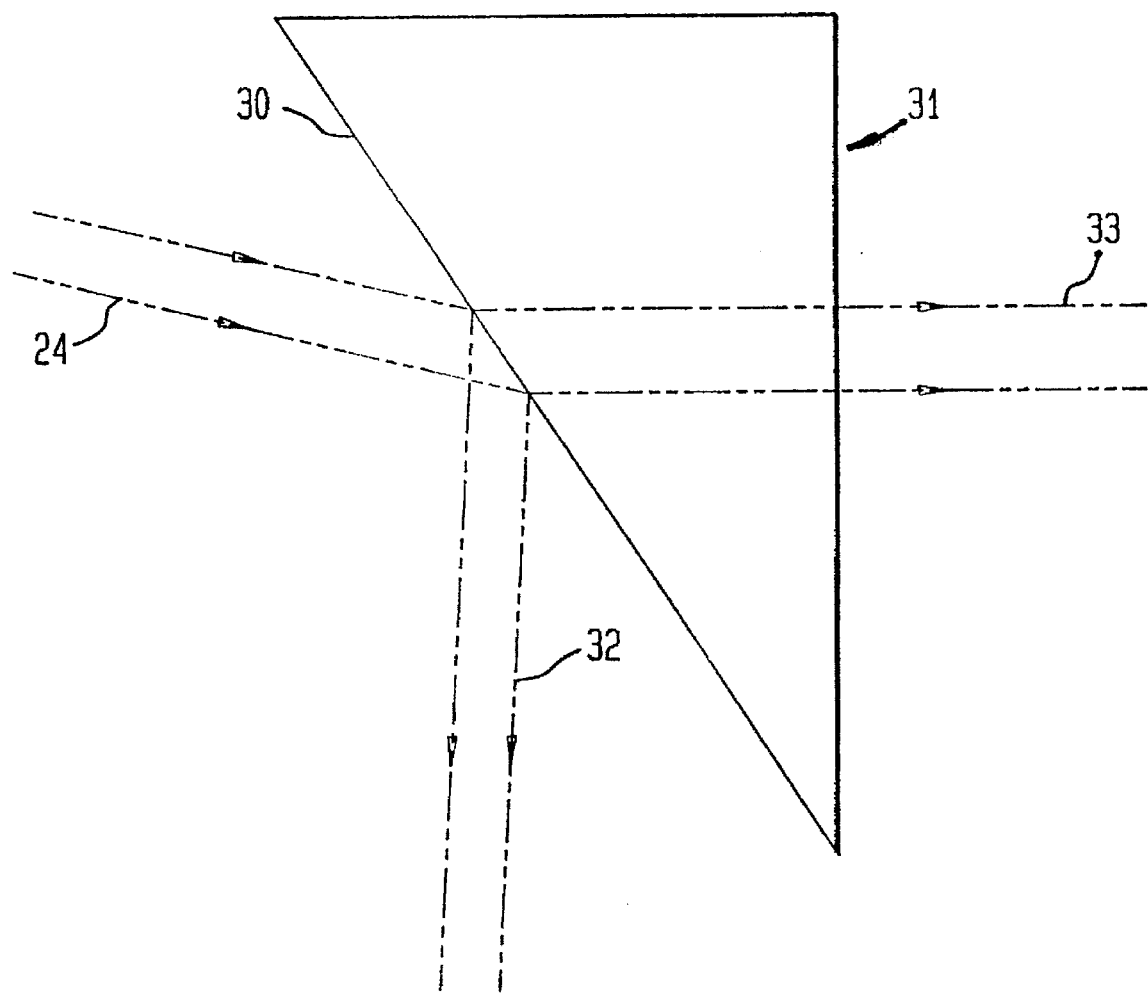
FIG. 6 is a schematic drawing illustrating yet another embodiment of the invention.

Another embodiment of the invention appears in FIG. 6. Here, a large auxiliary prism 31 replaces the function performed by the auxiliary prism 28 and beamsplitter 25 in FIGS. 2 to 5. Thus, in FIG. 6 a single optical element serves for the beamsplitting and beam expanding/compressing operations. Specifically, the input beam 24 of FIGS. 2 to 5 is incident on a face 30 of the large auxiliary prism 31, which is of the same shape as the auxiliary prism 28. The beam 32 reflected from the face 30 is the reference beam and the beam 33 refracted and transmitted by the prism constitutes the object beam. The ratio of the diameters (in the plane of the figure) of the reference and object beams 32 and 33 is the required value of 0.707. According to another embodiment of the invention, the auxiliary prism 31 is used to produce an object beam and a compressed reference beam.

According to an embodiment of the invention, a dielectric beamsplitter coating is deposited on the face 31 in order that the intensities of the object and reference beams have a desired ratio. If a proper ratio is selected, the need for the filters 29 and 29' may be eliminated.

The following deals with the relationship between the object and reference beam paths required to minimize sensitivity to scanner wobble. The aforementioned condition on the optical paths of the object paths of the object and reference beams for minimization of sensitivity to scanner wobble refers to the particular embodiment shown in FIG. 2. The condition for the general case may be stated as the minimization of the quantity:

$$\sum_i^N n_{oi} l_{oi} \left( \frac{d\theta_{ri}}{d\theta} \right)^2 - \sum_i^N n_{ri} l_{ri} \left( \frac{d\theta_{ri}}{d\theta} \right)^2$$

where $n_{oi}$ and $n_{ri}$ are the refractive indices of the ith sections of the object and reference beam paths;

$l_{oi}$ and $l_{ri}$ are the respective lengths of the ith sections of the object and reference beam paths illuminating the center of the holographic recording layer; and $$\frac{d\theta_{oi}}{d\theta} \text{ and } \frac{d\theta_{ri}}{d\theta}$$

describe the respective rates of change of angle of the object and reference beams in the ith sections of the object and reference beam path relative to a change in angle of the input beam.

The above condition is employed to take into account angular deflections in both xz and xy planes.

While embodiments of the invention have been described in detail, it will be evident to those skilled in the art that the invention may embodied otherwise without departing from its spirit and scope.

What is claimed is:

1. A method for recording a total internal reflection hologram of an object mask in a holographic recording layer, which method includes:

a) expanding a laser beam into an input beam;

b) dividing the input beam into an object beam and a reference beam;

c) directing the object beam to the holographic recording layer so that the object beam is incident on the surface of the holographic recording layer following transmission through the object mask;

d) directing the reference beam to the other side of the holographic recording layer at an angle such that it is totally internally reflected from the surface of the holographic recording layer and so that the reference beam is aligned with the object beam at the holographic recording layer;

e) compressing and/or expanding the object beam and/or reference beam in one dimension in order that the sizes and shades of areas of intersection of the object beam and reference beam with the holographic recording layer are the same and so that displacement of the input beam causes the object and reference beams to traverse the holographic layer at the same speed; and (f) displacing the input laser beam so that the object and reference beams traverse the holographic recording layer.

2. A method according to claim 1, further including the steps of measuring and adjusting the separation between the object mask and holographic recording layer so that the separation of the object mask and holographic recording layer where the object and reference beams are illuminating the holographic recording layer remains constant as the object and reference beams traverse the holographic recording layer.

3. A method according to claim 1, wherein directing the object and reference beams to the holographic recording layer includes arranging the optical paths of the object and reference beams in order that the misalignment of the object and reference beams at the holographic recording layer produced by an angular displacement of the input beam is minimized.

4. A method according to claim 1, wherein the displacement of the input beam describes a raster pattern.

5. A method according to claim 4, wherein the size of the steps in the raster pattern is approximately ¼ of the diameter of the input beam.

6. A method according to claim 1, further comprising scanning the input laser beam at the velocity (V) determined from the energy density (E) necessary to expose the hologram, the power (P) of the input laser beam and the step size (s) at the holographic recording layer according to the formula;

$$V=P/E\times S.$$

7. A method according to claim 1, further including the step of adjusting the intensity of the input laser beam as the input beam is displaced.

8. An apparatus for recording a total internal reflection hologram of an object mask in a holographic recording layer, which apparatus includes:

a) a beam expander for expanding a laser beam to an input beam;

b) a beamsplitter for dividing the expanded input laser beam into an object beam and a reference beam;

c) means for directing the object beam to the holographic recording layer so that the object beam is incident on the surface of the holographic recording layer following transmission through the object mask;

d) means for directing the reference beam to the other side of the holographic recording layer at an angle such that it is totally internally reflected from the holographic recording layer and so that the reference beam is aligned with the object beam at the holographic recording layer;

e) means for compressing and/or expanding the object beam and/or reference beam in one-dimension in order that the sizes and shapes of the areas of intersection of the object beam and reference beam with the holographic recording layer are identical and so that displacement of the input beam causes the object and reference beam to traverse the holographic layer at the same speed; and f) means for displacing the input laser beam so that the object and reference beams traverse the holographic recording layer.

9. An apparatus according to claim 8, wherein the means for compressing and/or expanding the object and/or reference beam includes one of a prism, a diffraction grating and a cylindrical lens system.

10. An apparatus according to claim 8, wherein the means for directing the object and reference beams to the holographic recording layer includes arranging the optical path lengths of the object and reference beams in order that the misalignment of the object and reference beams at the holographic recording layer produced an angular displacement of the input beam is minimized.

11. An apparatus according to claim 8, further including means for measuring and adjusting the separation between the object mask and holographic recording layer so that the separation of the object mask and holographic recording layer where the object and reference beams are illuminating the holographic recording layer remains constant as the object and reference beams traverse the holographic recording layer.

12. An apparatus according to claim 8, wherein the optical system includes a prism having an angle between to faces that follows the relationship:

$$\sin^2=(1-c^2)/(n^2-c^2)$$

where c is the ratio of the widths of the beams leaving and entering the prism and n is the refractive index of the prism material.

13. The apparatus according to claim 8, wherein the lengths of the sections of the optical path of the object beams $o_1$ and $o_2$ and the lengths of the sections of the optical path of the reference beam $r_1, r_2, r_3, r_4,$ and $r_5$ are arranged such that:

$$o_1+o_2=r_1+r_2+r_3/n+3r_4/2+3r_5/2n$$

where n is the refractive index of glass.

14. A method of recording a total internal reflection hologram, comprising:

dividing an input laser beam into an object beam and a reference beam, directing the object beam and the reference beam from opposite sides of a holographic recording layer so that the beams intersect the layer over two areas each smaller than the area of the layer and so the reference beam is totally internally reflected by the layer;

displacing the input beam so as to scan the object beam and the reference beam and move the first area and the second area simultaneously along the holographic recording layer;

adjusting cross-sections of the object beam and the reference beam relative to each other along one cross-sectional, dimension so that the first and second areas have the same size and shape during displacement of the input beam.

15. A method as in claim 14, wherein said object beam has an axis and said reference beam has an axis, and the step of directing the object beam includes directing the object beam to the holographic recording layer at a first angle relative to the layer and directing the reference beam to the holographic recording layer at a second angle relative to the layer different from the first angle; and the step of adjusting includes adjusting the cross-sectional dimension of one of the object beam and the reference beam in only one direction transverse to the axis of the one of the beams.

16. A method as in claim 14, further comprising displacing the coherent input beam so that the object and reference beams traverse the holographic recording layer along the direction of the adjusted cross-sectional dimension.

17. A method as in claim 14, wherein said object beam is directed normal to the layer and said reference beam being directed at the layer at an angle other than normal.

18. A method as in claim 14, wherein the step of adjusting includes changing the relative cross-sections of the beams along only one dimension with an optical member in the path of one of the beams.

19. A method as in claim 14, wherein said adjusting step includes changing the cross-sectional dimension of the reference beam with a unidirectional compressing member.

20. A method as in claim 14, wherein said adjusting step includes changing the cross-sectional dimension of the object beam with a unidirectional expanding member.

21. A method as in claim 20, wherein said adjusting step includes changing the cross-sectional dimension with a refractive member.

22. A method as in claim 18, wherein said adjusting step includes changing the cross-sectional dimension with a diffractive member.

23. A method as in claim 18, wherein said adjusting step includes changing the cross-sectional dimension with a cylindrical member.

24. A method as in claim 18, wherein the step of adjusting includes changing the relative cross-sections of the beams along one dimension with an optical member that maintains the cross-sectional dimension in the direction transverse to the one dimension.

25. A method as in claim 14, wherein said adjusting step includes optimizing the relative intensities of the object beam and the reference beam by maintaining a filter in the path of one of the object beam and the reference beam.

26. A method as in claim 14, wherein the adjusted dimension is in the object beam.

27. A method as in claim 14, wherein the adjusted dimension is in the reference beam.

28. A method as in claim 14, wherein the object beam is transmitted through a mask.

29. A method as in claim 28, wherein the adjusted dimension is in the object beam at the position where the input beam is split into the object beam and reference beam.

30. A method as in claim 1, wherein the compressing and/or expanding the object beam and/or reference beam in one dimension includes compressing and/or expanding the object beam and/or reference beam in only one dimension.

31. A method as in claim 30, wherein the adjusted dimension is in the reference beam at a position where the input beam is split into the object beam and reference beam.

32. An apparatus for recording a total internal reflection hologram, comprising:

a beam-splitter in the path of an input beam;

a total internal reflection holographic recording system having object and reference beams that intersect at two areas of a recording layer smaller than the total area of the layer;

a driver to move the input beam relative to the splitter and displace the areas along the layer in a layer scanning motion;

a beam cross-section changing optical member in the path of one of the beams and having an optical function to equalize the shape and size of the areas during the scanning motion.

* * * * *